United States Patent
Nguyen et al.

[11] Patent Number: 5,851,367
[45] Date of Patent: Dec. 22, 1998

[54] DIFFERENTIAL COPPER DEPOSITION ON INTEGRATED CIRCUIT SURFACES AND METHOD FOR SAME

[75] Inventors: Tue Nguyen, Camas; Lawrence J. Charneski, Vancouver; Sheng Teng Hsu, Camas, all of Wash.

[73] Assignees: Sharp Microelectronics Technology, Inc., Camas, Wash.; Sharp Kabushiki Kaisha, Osaka, Japan

[21] Appl. No.: 731,258

[22] Filed: Oct. 11, 1996

[51] Int. Cl.$^6$ .................................................. H01L 21/302
[52] U.S. Cl. ..................... 204/192.34; 438/677; 438/687; 438/694; 438/734; 438/706; 438/974; 427/524; 134/1.3
[58] Field of Search ..................... 438/675, 676, 438/677, 687, 694, 705, 720, 734, 906, 974; 427/533, 534, 535, 537, 576, 307, 337; 134/1.2, 1.3; 204/192.34

[56] References Cited

U.S. PATENT DOCUMENTS

| | | | |
|---|---|---|---|
| 4,351,712 | 9/1982 | Cuomo et al. | 204/192.34 |
| 4,540,607 | 9/1985 | Tsao | 427/253 |
| 4,777,061 | 10/1988 | Wu et al. | 438/685 |
| 4,886,681 | 12/1989 | Clabes et al. | 204/192.34 |
| 5,019,531 | 5/1991 | Awaya et al. | 438/687 |
| 5,085,731 | 2/1992 | Norman et al. | 156/646 |
| 5,187,120 | 2/1993 | Wang | 437/192 |
| 5,364,664 | 11/1994 | Tsubouchi et al. | 427/535 |
| 5,478,780 | 12/1995 | Koerner et al. | 438/656 |
| 5,498,768 | 3/1996 | Nishitani et al. | 437/192 |
| 5,580,615 | 12/1996 | Itoh et al. | 204/192.34 |
| 5,627,105 | 5/1997 | Delfino et al. | 438/627 |
| 5,630,765 | 5/1997 | Kondo et al. | 437/192 |
| 5,663,098 | 9/1997 | Creighton et al. | 438/675 |
| 5,679,471 | 10/1997 | Cheng et al. | 428/673 |

FOREIGN PATENT DOCUMENTS 62-262429 A  11/1987  Japan .
322420       11/1971  U.S.S.R. .

OTHER PUBLICATIONS

Berg, S. et al "Ion assisted selective thin film deposition" J. Vac. Sci. Technol.A vol.4, No.3, pp. 448–452, May 1986.

Frank, R.A. et al "Ion Milling of Via Holes" IBM Tech. Discl. Bull., vol. 23, No. 5, p.1409, Oct. 1980.

Wood, J.C. "Cleaning of metal surfaces by ion etching" IBM Tech. Discl. Bull., vol. 24., No. 7A, pp. 3207–3208, Dec. 1981.

Bodo, P. et al "Adhesion of evaporated titanium films to ion–bombarded polyethylene" J Appl Phys 60 (3) pp. 1161–1168, Aug. 1986.

*Primary Examiner*—R. Bruce Breneman
*Assistant Examiner*—Anita Alanko
*Attorney, Agent, or Firm*—Gerald W. Maliszewski; David C. Ripma

[57] ABSTRACT

A method for selectively applying CVD copper to metallic surfaces, that are co-located with non-metallic surfaces, is provided. The method prepares both the metal and non-metallic surfaces with a low energy ion etch of an inert gas through the use of an ion gun. The etching promotes the growth of copper on the metallic surface, and inhibits the growth on the non-metallic surface. Following an application of CVD copper, the surfaces are etched again to clean any residual copper from the non-metallic surface, and to again prepare the surfaces for another deposition of copper. Through repeated cycles of etching and copper deposition, the copper overlying the metallic surface is accumulated to achieve the desired thickness, while the non-metallic surface remains free of copper. A method is also provided for the selective deposition of copper on metallic surfaces to fill interconnects in damascene IC structures. An IC with a copper layer overlying a metallic surface, co-located with a non-metallic surface, where the copper layer is grown through repeated cycles of ion etching and copper deposition, is also provided.

17 Claims, 4 Drawing Sheets

DIFFERENTIAL COPPER DEPOSITION ON INTEGRATED CIRCUIT SURFACES AND METHOD FOR SAME

BACKGROUND AND SUMMARY OF THE INVENTION

This invention relates generally to integrated circuit processes and fabrication, and more particularly, to an integrated circuit and method of differentially depositing copper on selected integrated circuit surfaces.

The demand for progressively smaller, less expensive, and more powerful electronic products, in turn, fuels the need for smaller geometry integrated circuits (ICs), and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different impedance characteristics.

There is a need for interconnects and vias to have both low resistivity, and the ability to withstand volatile process environments. Aluminum and tungsten metals are often used in the production of integrated circuits for making interconnections or vias between electrically active areas. These metals are popular because they are easy to use in a production environment, unlike copper which requires special handling.

Copper (Cu) is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also much superior to those of aluminum. Aluminum is approximately ten times more susceptible than copper to degradation and breakage due to electromigration. As a result, a copper line, even one having a much smaller cross-section than an aluminum line, is better able to maintain electrical integrity.

There have been problems associated with the use of copper, however, in IC processing. Copper pollutes many of the materials used in IC processes and, therefore, care must be taken to keep copper from migrating. The migration of copper into silicon semiconductor regions is especially harmful. The conduction characteristics of the semiconductor regions are a consideration in the design of a transistors. Typically, the fabrication process is carefully controlled to produce semiconductor regions in accordance with the design. Elements of copper migrating into these semiconductor regions can dramatically alter the conduction characteristics of associated transistors.

Various means have been suggested to deal with the problem of copper diffusion into integrated circuit material. Several materials, especially metallic ones, have been suggested for use as barriers, at least partially encapsulating copper structures, to prevent copper diffusion into susceptible circuits. Tungsten, molybdenum, and titanium nitride (TiN) have also been suggested for use as copper diffusion barriers. By using a metallic barrier material copper can electrically communicate with semiconductor regions, and yet be physically isolated. However, the adhesion of copper to these diffusion barrier materials has been an IC process problem, and the electrical conductivity of such materials is an issue in building IC interconnects.

The deposition of copper on IC surfaces, as mentioned above, is a process problem. It is inconvenient to cover an IC surface with a layer of copper, and then etch portions of the copper layer to form interconnect structures as is done with other metals. Copper is removed at high temperatures, which potentially harms associated silicon, oxide, semiconductor, and metal structures. Since copper is typically deposited at high temperatures, it is difficult to use photoresist as a mask to cover areas of an IC surface where an application of CVD copper is not desired. Photoresist becomes degraded at high temperatures. Therefore, copper interconnect features are often formed with a currently developing damascene method.

The damascene method for forming a via between a substrate surface and an overlying dielectric surface is described below. The underlying substrate surface is first completely covered with a dielectric, such as oxide. A patterned photoresist profile is then formed over the oxide. The resist profile has an opening, or hole, in the photoresist corresponding to the area in the oxide where the via is to be formed. Other areas of the oxide to be left in place are covered with photoresist. The photoresist covered dielectric is then etched to remove oxide underlying the hole in the photoresist. The photoresist is then stripped away. CVD copper is then used to fill the via. A layer consisting of oxide with a copper via through it now overlies the substrate surface. The excess copper remaining is removed with a chemical mechanical polish (CMP) process, as is well known in the art.

Besides adhesion and etching difficulties, it is also a problem to deposit copper onto a substrate, or in a via, using the conventional processes for the deposition of aluminum when the geometries of the selected IC features are small. That is, new deposition processes have been developed for use with copper, instead of aluminum, in the lines and interconnects of an IC interlevel dielectric. It is impractical to sputter metal, either aluminum or copper, to fill small diameter vias, since the gap filling capability is poor. To deposit copper, first, a physical vapor deposition (PVD), and then, a chemical vapor deposition (CVD) technique have been developed by the industry.

With the PVD technique, an IC surface is exposed to a copper vapor and copper condenses on the surfaces. The technique is not selective with regard to surfaces. When copper is to be deposited on a metallic surface, adjoining non-conductive surfaces must either be masked or etched clean in a subsequent process step. As mentioned earlier, photoresist masks and other adjoining IC structures are typically damaged at the high temperatures at which copper is vaporized. The CVD technique is an improvement over PVD because it is more selective as to which surfaces copper is deposited on. The CVD technique is selective because it relies on a chemical reaction between the metallic surface and the copper vapor to cause the deposition of copper on the metallic surface.

In a typical CVD process, copper is combined with a ligand, or organic compound, to make the copper volatile.

That is, copper becomes an element in a compound that is vaporized into a gas. Selected surfaces of an integrated circuit, such as diffusion barrier material, are exposed to the copper gas, or precursor, in an elevated temperature environment. When the copper gas compound decomposes, copper is left behind on the selected surface. Several copper gas compounds are available for use with the CVD process. It is generally accepted that the configuration of the copper gas compound, at least partially, affects the ability the copper residue to adhere itself to the selected surface.

Norman et al., U.S. Pat. No. 5,085,731, discloses precursors to deposit copper on conductive surfaces. These precursors react chemically to selectively deposit copper on metallic conductive surfaces, but not non-metallic surfaces. However, the application of CVD copper typically becomes less selective the longer the process continues. After a period of time, copper eventually begins to accumulate on the non-conductive surface. Once a layer of copper is established on the non-conductive surface, the growth rates of deposited copper on conductive and non-conductive surfaces are substantially the same.

It would be advantageous if copper could be deposited on IC surfaces without the necessity of masking non-conductive surfaces, or performing a substantial etching process to remove copper from non-conductive surfaces.

It would be advantageous if copper interconnects, studs, and lines could be formed without the necessity of using a damascene process to protect adjoining non-conductive surfaces.

It would be advantageous to employ a method of selectively depositing copper on conductive and non-conductive IC surfaces. Further, it would be advantageous to selectively deposit copper to adjoining conductive and non-conductive surfaces.

It would be advantageous if a method were employed for preparing both conductive and non-conductive surfaces, in advance of an application of CVD copper, to improve the selectivity of the copper deposited on the surfaces.

Accordingly, a method of differentially depositing copper on selected IC surfaces is provided. The selected surfaces include conductive and non-conductive surfaces applied to selected regions of the IC. The method comprising the steps of: exposing each selected surface to a source of ions; etching each selected surface to remove contaminants and undesired IC materials that have collected on the non-conductive surface; and applying CVD Cu to each selected surface, forming a relatively thick layer of Cu overlying conductive surfaces, and a relatively thin layer of Cu overlying the non-conductive surfaces, whereby the exposure of the selected surfaces promotes variations in the rates at which Cu is deposited.

Preferably, the three process steps, mentioned above, are repeated a plurality of times to differentially deposit copper on each selected surface a plurality of times. The undesired IC material removed from the non-conductive surface is copper, whereby the layer of copper overlying the conductive surface is made progressively thicker while maintaining a copper-free non-conductive surface. Cu is deposited on each selected surface until less than approximately a monolayer of Cu is accumulated on the non-conductive surface. Then, each selected surface is etched until the Cu accumulated on the non-conductive surface is removed.

The source ions, to which each selected surface is exposed, are generated from an inert gas, whereby chemical reactions between the ions and the selected surfaces are minimized. The inert gas is selected from the group consisting of Ar, He, Ne, Kr, $H_2$, $N_2$, and Xe. The source ions have an energy level of generally less than 150 eV to control the smoothness of the non-conductive surfaces, and to minimize the etching of non-conductive surface material. The selected surfaces are exposed to a source of ions in a low pressure environment of less than approximately 10 mT, whereby the ion bombardment is anisotropic.

Also provided is an adherent copper conductor interface on an integrated circuit (IC) formed from the differential deposition of Cu on the IC. The Cu conductor interface comprises a conductive surface of IC material, and a non-conductive surface of IC material. The Cu interface also comprises a layer of Cu overlying said conductive surface. The Cu layer is formed through repeated deposition cycles with each deposition cycle including an exposure of both conductive and non-conductive surfaces to a low energy ion source of an inert gas to etch the IC surfaces, followed by an application of CVD Cu to deposit a relatively thin layer of Cu on the non-conductive surface and a relatively thick layer of Cu on the conductive surface. In this manner, Cu is selectively deposited on conductive and non-conductive IC surfaces to form an interconnect between the conductive surface and other regions of the IC.

DETAILED DESCRIPTION OF THE PREFERRED EMBODIMENT

Figure 1:
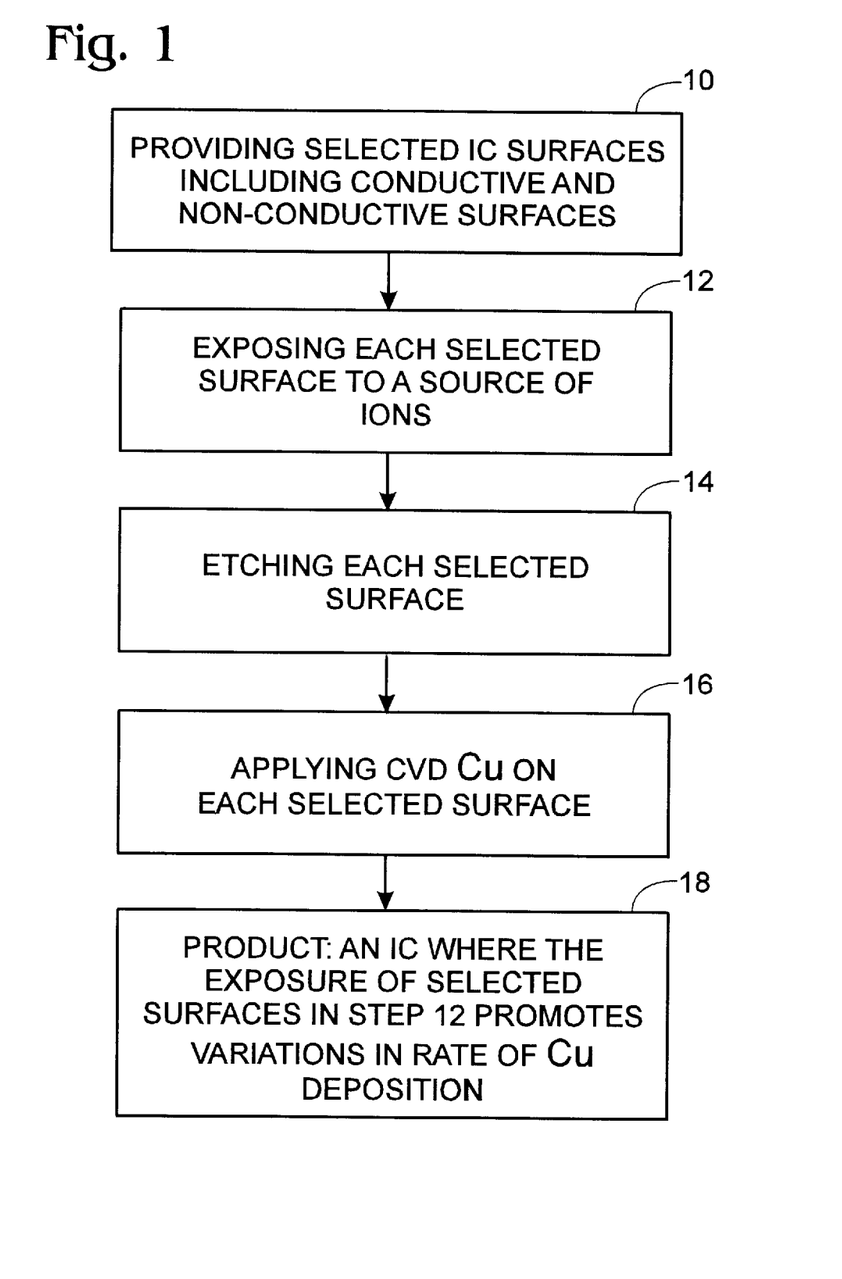
FIG. 1 is a flow chart illustrating steps in the method of differentially depositing copper on selected integrated circuit surfaces.

FIG. 1 is a flow chart illustrating steps in the method of differentially depositing copper on selected integrated circuit surfaces. Step 10 provides selected surfaces including conductive surfaces and non-conductive surfaces applied to selected regions of the IC. Step 12 exposes each selected surface to a source of ions. Step 14 etches each selected surface to remove contaminants and undesired IC materials that have collected on the non-conductive surface. Step 16 applies CVD Cu to each selected surface exposed in Step 12, forming a relatively thick layer of Cu overlying conductive surfaces, and a relatively thin layer of Cu overlying the non-conductive surfaces. Step 18 is the product, An IC where the exposure of the selected surfaces in Step 12 promotes variations in the rates at which Cu is deposited.

Figure 2:
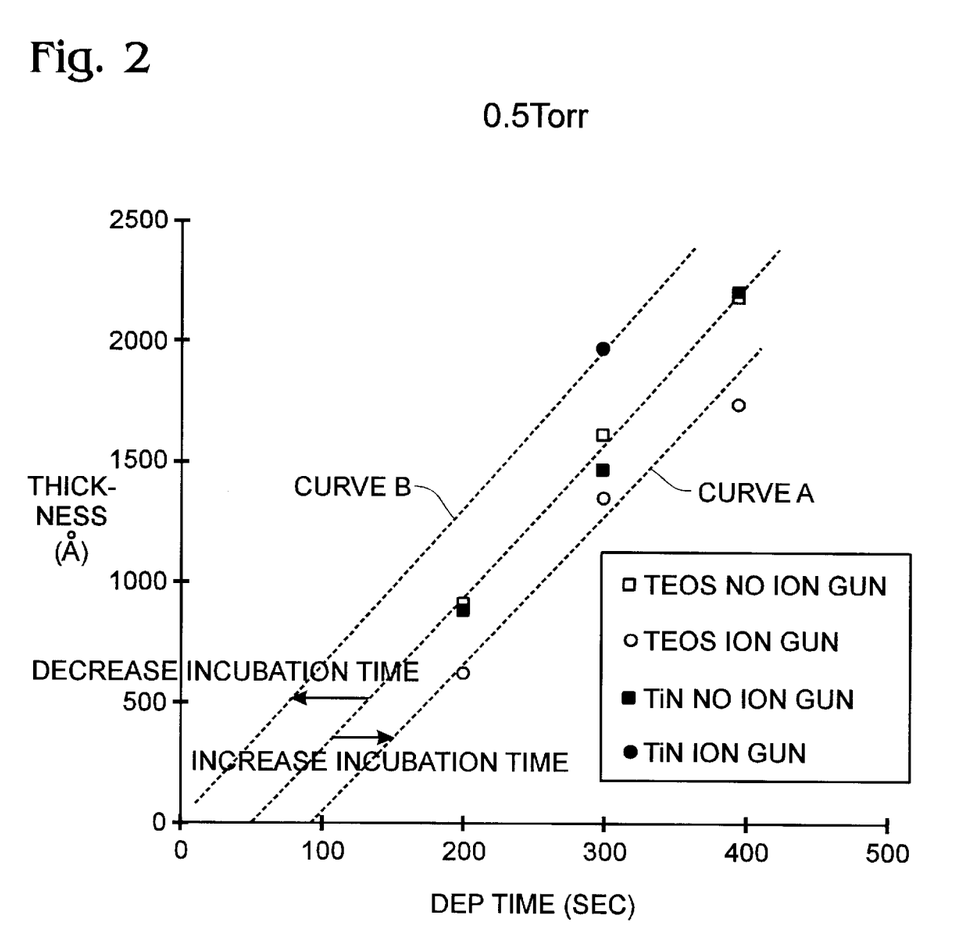
FIG. 2 is graph illustrating the selectivity of copper deposited on TEOS and TiN surfaces both with, and without, the ion exposure of the present invention.

The selected surfaces are exposed to a source of ions, and in response, the surfaces are etched. In some embodiments, Steps 12 and 14 are combined. Etching the conductive surface promotes the application of CVD copper, while etching the non-conductive inhibits the deposition of copper. FIG. 2 is graph illustrating the selectivity of copper deposited on TEOS and TiN surfaces both with, and without, the ion exposure of the present invention. The graph displays the thickness of the copper deposition on one axis and the time of the deposition on the other axis. The curve is of most interest in the period of time before approximately 100 seconds. Once copper begins to form on a surface, be it TEOS or TiN, the deposition rates are substantially the same. Before ion exposure, the deposition rate of CVD copper on both surfaces is approximately the same. For example, at 300 seconds the deposition thickness of copper on the TEOS (non-conductive) surface is approximately the same as the thickness on the TiN (conductive) surface, approximately 1400–1500 Å. After treatment with an ion source, the deposition of copper on TEOS decreases about 300 Å, and the deposition of copper on the TiN increases approximately 500 Å. Alternately, it can be said that at 300 seconds the deposition ratio of TiN to TEOS surfaces changes from 0.9 (1450 Å/1600 Å) to 1.44 (1950 Å/1350 Å) after treatment with an ion gun.

Returning to FIG. 1, in a preferred embodiment, Steps 12 through 16 are repeated a plurality of times to differentially deposit Cu on each selected surface a plurality of times. The undesired IC material removed from the non-conductive surface in Step 14 is Cu, whereby the layer of Cu overlying the conductive surface is made progressively thicker while maintaining a Cu-free non-conductive surface. That is, the copper layer over the conductive surface is formed by repeating the method depicted in FIG. 1 until the desired copper layer thickness is achieved. Every time the process cycles through Step 14 the surfaces are etched until any copper that has accumulated on the non-conductive surface is removed. In this manner, the final product has a copper layer formed over the conductive surface and substantially no copper layer formed over the non-conductive surface. In some processes a final etching step may be required to clean copper from the non-conductive surface.

In one embodiment, Step 16 includes depositing Cu on each selected surface until less than approximately a monolayer of Cu is accumulated on the non-conductive surface. Then, each selected surface is etched in Step 14 (in the next cycle) until the Cu accumulated on the nonconductive surface, previously in Step 16, is removed. In some circumstances, the process is most selective when the copper deposition is halted just as copper begins to accumulate on the non-conductive surface.

In an alternate embodiment, Step 16 includes depositing Cu on each selected surface until a predetermined thickness of Cu is accumulated on the non-conductive surface. The predetermined thickness is selected from empirical data so that a maximum thickness of Cu is accumulated on the conductive surface after one deposition cycle of Steps 12 through 16, whereby the selectivity of the Cu deposition process is optimized. An object of the copper deposition process is to accumulate the maximum thickness of copper on the conductive surface after copper is removed from the non-conductive surface in Step 14. The copper thickness on the conductive surface is dependent on how much copper is deposited in Step 16, and how much copper is removed in Step 14 as the non-conductive surface is etched. In some circumstances, the total accumulation of copper on the conductive surface after one deposition cycle of Steps 12 through 16 is optimized by allowing more than a monolayer of copper to accumulate on the non-conductive surface in Step 16.

Returning to FIG. 2, curve A depicts the thickness of copper deposition on an ion prepared TEOS surface. It can be seen that copper is not deposited in a CVD copper environment until approximately 100 seconds into the process. Curve B depicts the thickness of copper deposition on an ion prepared TiN surface. It can be observed that at 100 seconds approximately 500 Å of copper have been deposited. In light of the present example, the method of the present invention repeatedly exposes the surfaces to an ion gun, followed by 100 seconds of exposure to CVD copper. In this manner, a 5000 Å thick layer of copper is formed over the TiN layer after approximately 10 cycles of the process illustrated in FIG. 1. At the end of these 10 cycles the thickness of the copper layer over the TEOS surface is approximately zero.

Returning again to FIG. 1, it is a feature of the invention that Step 12 includes generating the source ions from an inert gas, whereby chemical reactions between the ions and the selected surfaces are minimized. The inert gas is selected from the group consisting of Ar, He, Ne, Kr, $H_2$, $N_2$, and Xe. Generally (in the prior art), contaminants and undesired compounds are etched from surfaces by exposure to either ions that merely supply kinetic energy for the process, or by reactive ions, such as oxygen, which react chemically with the contaminants to remove them from the surface. While not intending to be limited by concept, it is believed that the inert gas ions are effective because they leave the surfaces with a relatively low number non-native compounds. After contaminant removal, the conductive surface is reactive and readily bonds with copper molecules, while the non-conductive surface is composed of stable compounds that tend not to react with copper. As mentioned below, the inert ions used in the present invention are generally of a low power level. Once again, any chemical reactions that may be result from exposure to the ions are minimized as the penetration of ions into the selected surfaces is minimal.

It is also a feature of the invention that Step 12 includes source ions having an energy level of generally less than 150 eV to control the smoothness of the non-conductive surfaces, and to minimize the etching of non-conductive surface material in Step 14. Step 14 can be performed more quickly by increasing the energy level of the ions. However, a higher energy etch tends to remove more IC material from a surface. As the non-conductive surface is cleaned of copper in Step 14, it is desirable to minimize the damage to the surface. When higher energy ions are used, the copper is removed quicker, but the surface becomes rough. A rough surface makes the removal of copper in subsequent etch steps more difficult. In addition, the electrical characteristics of the circuit are sometimes detrimentally effected when a excess of surface is removed.

A method of the present invention is applicable to conductive surfaces selected from the group consisting of TiN, TiON, TiSiN, TaSiN, TaN, TiW, TiWN, Mo, and WN, whereby Cu is deposited on a barrier material to prevent the diffusion of Cu into regions of the IC underlying the conductive surface. Likewise, the method is also applicable to conductive surfaces selected from the group consisting of Al, Cu, W, and Ti, whereby CVD Cu is differentially deposited on metal surfaces. The method of the invention is effective with most metal, or metallic, surface materials.

The method of the present invention is applicable to non-conductive surfaces selected from the group consisting of TEOS oxide, BN, SiBN, SiN, fluorinated oxide, silicon oxide, and polymers. In general, the method is effective on most insulation and electrically inert barrier materials used in IC processes.

Figure 3:
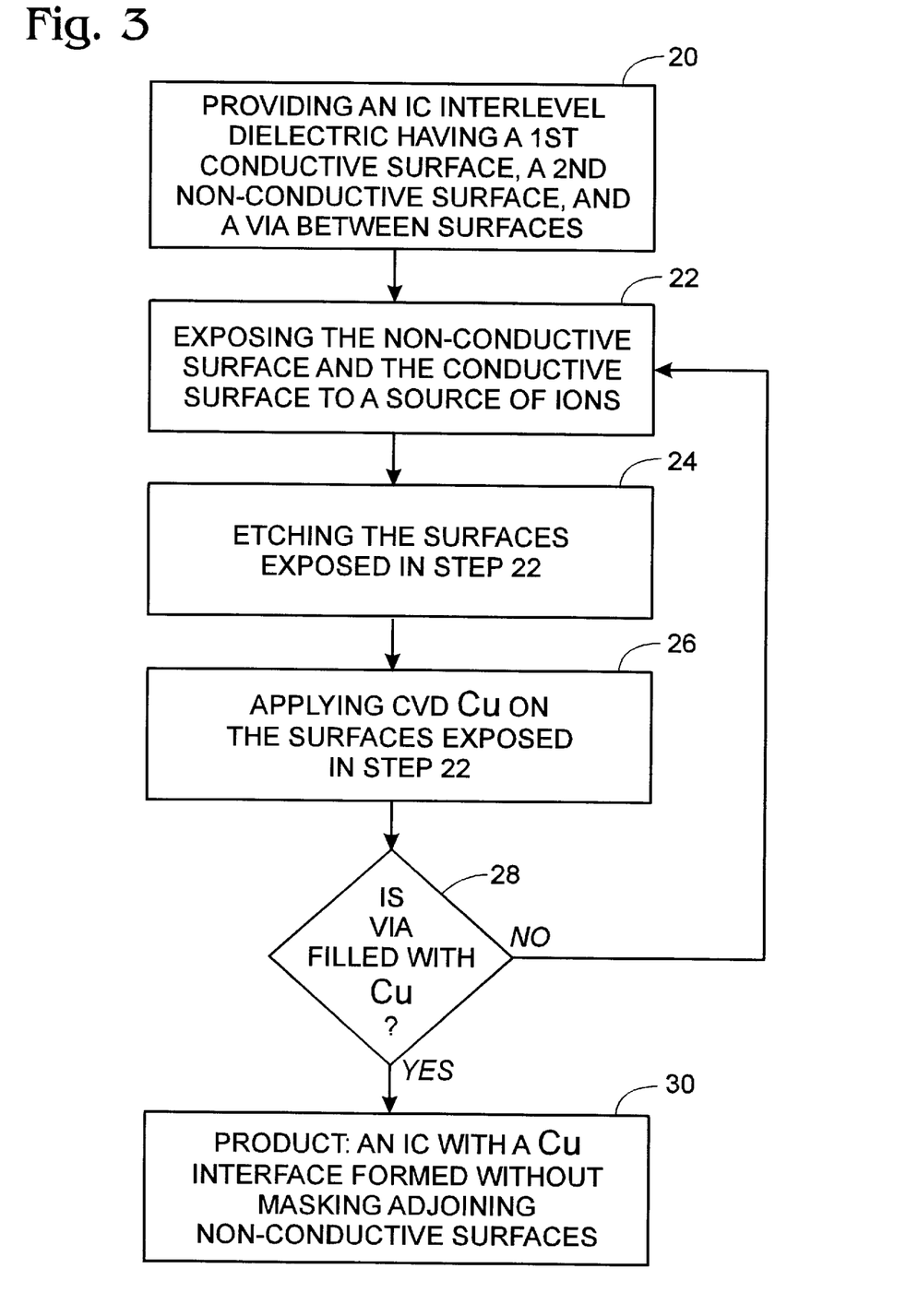
FIG. 3 is a flow chart illustrating steps in the method for selectively depositing copper to form an interconnection stud between IC dielectric interlevels.

FIG. 3 is a flow chart illustrating steps in the method for selectively depositing copper to form an interconnection stud between IC dielectric interlevels. Step 20 provides an IC having a first IC surface including a conductive connection area with a conductive surface, a second IC surface having a non-conductive surface overlying the first surface, and a via, having vertical walls, between the non-conductive surface and the conductive surface. Step 22 exposes the non-conductive surface and the conductive surface to a source of ions. Step 24 etches the surfaces exposed in Step 22 to remove contaminants and undesired IC materials that have collected on the non-conductive surface. Step 26 applies CVD Cu to the surfaces exposed in Step 22, and the walls of the via, until approximately less than a monolayer of Cu is accumulated on the non-conductive surface. Step 28 determines if the via is filled with copper, if not, the process continues back to Step 22 to repeat the ion exposure. That is, Steps 22 through 26 are repeated until the via is substantially filled with copper. When the via is filled with copper, the process continues to Step 30. Step 30 is the product, an IC with Cu interfaces between dielectric interlevels, formed without masking adjoining non-conductive surfaces.

The principle of filling a via, or other IC structure, with copper as depicted in FIG. 3 is essentially the same as described above with FIG. 1. The conductive surface in the bottom of the via on the first surface, and the non-conductive surface surrounding the via on the second surface, are exposed to cycles of ion etching followed by copper deposition. The via is filled as copper builds up in successive layers on the conductive surface. In each cycle, CVD copper is applied until copper begins to accumulate on the non-conductive on the second surface. Any copper that has accumulated on the non-conductive surface around the via after a step of copper deposition, is removed in a subsequent etching step. Although copper is also removed from the conductive surface during an etch step, the overall result is that copper accumulates on the conductive surface, but not on the non-conductive surface.

In a preferred embodiment of the invention, the Cu stud is formed in Step 28 primarily from the progressive deposition of Cu on the via walls, whereby the Cu deposition processes used to form a stud are expedited. It has been found that the deposition method of the present invention is pattern dependent. If a via is sufficiently large, copper is formed on a conductive surface, as described above with FIG. 1, to fill the via. However, most IC vias are relatively small, well under 1 micron in diameter. When the method of the present invention is used with small vias, CVD copper is applied to the via walls, as well as on the conductive surface and the non-conductive second IC surface. Generally, the ion source used in Step 22 is as least partially anisotropic. The conductive surface and the second IC surface are normal to the flow of ions, while the via walls are parallel to the ion flow. When the surfaces are etched in Step 24, copper accumulations on the via walls are removed to a lesser extent than copper on the normal surfaces.

To further take advantage of the growth on the via walls, Step 24 includes performing the ion etch in a low pressure environment of less than approximately 10 mT, whereby the anisotropic ion flow minimizes etching of Cu formed on the via walls, and so expedites the formation of the Cu stud. As is well known in the art, a low pressure environment minimizes the number of random ion collisions which, in turn, randomize the direction of ion flow. A low pressure environment insures that an anisotropic ion flow remains anisotropic.

In many circumstances the vertical via walls are formed from a diffusion barrier material. Typically, the diffusion barrier material is conductive, as an electrical connection is needed between the copper in the via and a semiconductor surface at the bottom of the via. The diffusion barrier prevents copper from migrating into regions of surrounding IC material between the first and second surfaces. Even if the surrounding material is an electrical insulator, the copper migration sometimes continues through the insulator into semiconductor materials to modify the designed conduction characteristics of the semiconductor. When the migration of copper is an issue, diffusion barrier material is required along the via walls. However, in some circumstances copper migration is not an issue, so that a diffusion barrier is unnecessary. It is a feature of the invention that the via vertical wall surface is non-conductive, whereby the Cu deposited on the via walls in Step 26 is initially deposited on a non-conductive surface. As noted above, since the via walls are parallel to the ion flow, the surface is relatively unaffected by ions. Therefore, the initial etching performed in Step 24 does not inhibit the deposition of copper on the via walls, even when the via walls are non-conductive. As a result, the growth of copper on the non-conductive via walls is not inhibited as it would be on a surface normal in direction to the ion flow.

Figures 4, 5:
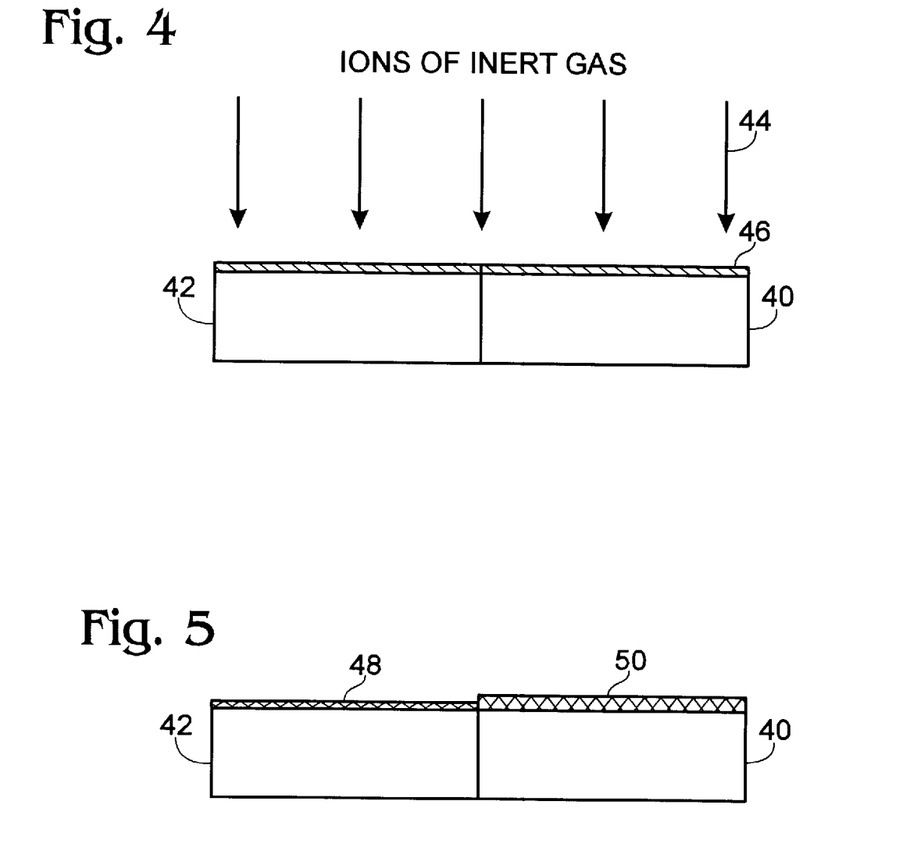
FIGS. 4 through 6 illustrate steps in the method of forming a completed adherent copper conductor interface on an integrated circuit formed from differential deposition of copper on the IC.
Figure 6:
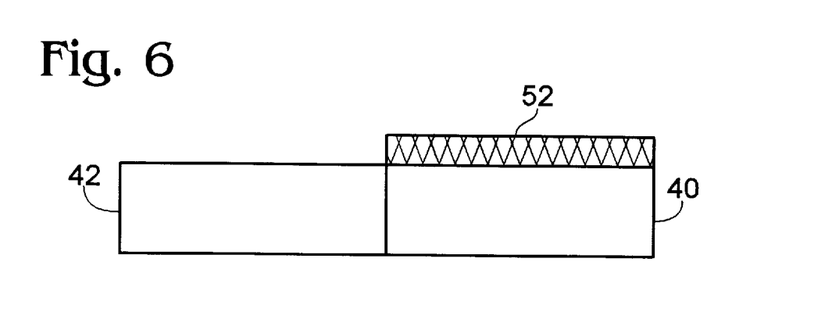

FIGS. 4 through 6 illustrate steps in the method of forming a completed adherent copper conductor interface on an integrated circuit formed from differential deposition of copper on the IC. FIG. 4 illustrates an IC comprising a conductive surface of IC material 40, and a non-conductive surface of IC material 42. Surfaces 40 and 42 are exposed to an ion source of an inert gas represented by lines 44. Ions 44 etch surfaces 40 and 42. The etched areas of surfaces 40 and 42 are represented by region 46 overlying surfaces 40 and 42.

FIG. 5 illustrates the IC of FIG. 4 after one deposition cycle, with each deposition cycle including the exposure of both conductive surface 40 and non-conductive surface 42 to low energy inert gas ion source 44 to etch surfaces 40 and 42 (FIG. 4), followed by an application of CVD copper to deposit a relatively thin layer of Cu 48 on non-conductive surface 42 and a relatively thick layer of Cu 50 on conductive surface 40. When surfaces 40 and 42 are next etched, in the following deposition cycle, thin copper layer 48 is removed from non-conductive surface 42. A part of thick copper layer 50 is also removed during the same etching. However, the general result is that copper is accumulated on conductive surface 40 while non-conductive surface 42 remains free of copper.

FIG. 6 illustrates the IC of FIG. 5 further comprising a layer of copper 52 overlying conductive surface 40. Copper layer 52 is formed through repeated deposition cycles, whereby Cu is selectively deposited on conductive 40 and non-conductive 42 IC surfaces to form an interconnect between conductive surface 40 and other regions of the IC. Typically, copper layer 52 is a copper filled trench used to electrically interconnect surface 40 to another conductive surface (not shown) on the same dielectric interlevel. Alternately, copper layer 52 is a copper filled via to interconnect conductive surface 40 to a conductive surface (not shown) on another interlevel. In some circumstances one final etching is performed, after the last deposition cycle, to clear non-conductive surface 42 of any residual copper.

The continuing development of ICs with copper interfaces requires that more efficient means of depositing copper be found. The present invention discloses a method of increasing the selectivity of CVD copper on co-located conductive and non-conductive surfaces. The invention also discloses a relatively simple method of applying CVD copper to form interconnect structures, such as studs and lines. Through exposure of the surfaces to a flow of ions, the growth of copper on conductive surfaces is promoted, and the growth of copper on non-conductive surfaces is inhibited. The method of the present invention does not require that nonconductive surfaces be masked, or that the IC be subjected to the process of etching a thick layer of copper from surfaces where copper has unintentionally accumulated. Since thick layers of copper are typically removed at relatively high temperatures, the method of the present invention is less destructive to surrounding silicon and photoresist structures.

In an alternate embodiment of the invention, other metals besides copper are differentially deposited on selected surfaces. Although the present invention was specifically developed for use with the application of CVD copper, the method is effective with alternate metals from Cu differentially deposited on selected IC surfaces, so that Step 16 includes a CVD metal alternative selected from the group consisting of W, Al, and Ti. Typically, the above mention metals can be effectively deposited without using the present method. However, the method of the present invention, is also used with these metals to enhance selective deposition.

In an alternate embodiment, the present invention is also presented as applicable to filling, with copper, vias formed through the damascene method. Copper is deposited in the vias without having to take extensive precautions with adjoining non-conductive surfaces where the deposition of copper is not desired. Although via structures, with corresponding studs, have been specifically described, the present invention is also applicable to all damascene structures including trenches, and dual damascene structures including vias and trenches. Other variation and embodiments of the present invention will occur to those who are skilled in the art.

What is claimed is:

1. A method of differentially depositing metal on selected integrated circuit (IC) surfaces, the selected surfaces including conductive surfaces and a non-conductive surfaces applied to selected regions of the IC, the method comprising the steps of:
   a) exposing each selected surface to an ion gun source of inert ions;
   b) directly following step a), etching each selected surface to remove contaminants and undesired IC materials that have collected on the non-conductive surface while minimizing the energy of the ions impinging into the selected surfaces, whereby IC material is not removed from a surface by the kinetic energy of the ions introduced in Step a); and
   c) directly following step b), applying CVD metal to each selected surface exposed in step a), forming a thick layer of metal overlying conductive surfaces, and a thin layer of metal overlying the non-conductive surfaces, whereby the exposure of the selected surfaces in step a) promotes variations in the rates at which metal is deposited.

2. A method as in claim 1 in which step c) includes the CVD metal being selected from the group consisting of Cu W, Al, and Ti.

3. A method of differentially depositing copper (Cu) on selected integrated circuit (IC) surfaces, the selected surfaces including conductive surfaces and a non-conductive surfaces applied to selected regions of the IC, the method comprising the steps of:
   a) exposing each selected surface to an ion gun source of inert ions;
   b) directly following step a), etching each selected surface to remove contaminants and undesired IC materials that have collected on the non-conductive surface while minimizing the energy of ions impinging into selected surfaces, whereby IC material is not removed from a surface by the kinetic energy of the ions introduced in Step a); and
   c) directly following step b), applying CVD Cu to each selected surface exposed in step a), forming a thick layer of Cu overlying conductive surfaces, and a thin layer of Cu overlying the non-conductive surfaces, whereby the exposure of the selected surfaces in step a) promotes variations in the rates at which Cu is deposited.

4. A method as in claim 3 in which steps a) through c) are repeated a plurality of times to differentially deposit Cu on each selected surface a plurality of times, and in which the undesired IC material removed from the non-conductive surface in step b) is Cu, whereby the layer of Cu overlying the conductive surface is made progressively thicker while maintaining a Cu-free non-conductive surface.

5. A method as in claim 4 in which step c) includes depositing Cu on each selected surface until less than a monolayer of Cu is accumulated on the non-conductive surface, and in which each selected surface is etched in step b) until the Cu accumulated on the non-conductive surface, previously in step c), is removed.

6. A method as in claim 4 in which step c) includes depositing Cu on each selected surface until a thickness of Cu is accumulated on the non-conductive surface, in which each selected surface is etched in step b) until the Cu accumulated on the non-conductive surface, previously in step c), is removed, and in which the thickness is selected so that a maximum thickness of Cu is accumulated on the conductive surface after one deposition cycle of steps a) through c), whereby the selectivity of the Cu deposition process is optimized.

7. A method as in claim 3 in which step a) includes generating the source ions from an inert gas, whereby chemical reactions between the ions and the selected surfaces are minimized.

8. A method as in claim 7 in which the inert gas is selected from the group consisting of Ar, He, Ne, Kr, $H_2$, $N_2$, and Xe.

9. A method as in claim 3 in which step a) includes source ions having an energy level of less than 150 eV to control the smoothness of the non-conductive surfaces, and to minimize the etching of non-conductive surface material in step b).

10. A method as in claim 3 in which the conductive surface is selected from the group consisting of TiN, TiON, TiSiN, TaSiN, TaN, TiW, TiWN, Mo, and WN, whereby Cu is deposited on a barrier material to prevent the diffusion of Cu into regions of the IC underlying the conductive surface.

11. A method as in claim 3 in which the conductive surface is selected from the group consisting of Al, Cu, W, and Ti, whereby CVD Cu is differentially deposited on metal surfaces.

12. A method as in claim 3 in which the non-conductive surface is selected from the group consisting of TEOS oxide, BN, SiBN, SiN, fluorinated oxide, silicon oxide, and polymers.

13. A method as in claim 3 in which step a) includes exposing the selected surfaces in a low pressure environment of less than approximately 10 mT, whereby the ion source is anisotropic.

14. A method for selectively depositing Cu to form an interconnection stud between IC dielectric interlevels, the IC having a first IC surface including a conductive connection area with a conductive surface, a second IC surface having a non-conductive surface overlying the first surface, and a via, having vertical walls, between the non-conductive surface and the conductive surface, the method comprising the steps of:

a) exposing the non-conductive surface and the conductive surface to an ion gun source of inert ions;

b) directly following step a), etching the surfaces exposed in step a) to remove contaminants and undesired IC materials that have collected on the non-conductive surface while minimizing the energy of the ions impinging into the selected surfaces, whereby IC material is not removed from a surface by the kinetic energy of the ions introduced in Step a);

c) directly following step b), applying CVD Cu to the surfaces exposed in step a), and the walls of the via, until less than a monolayer of Cu is accumulated on the non-conductive surface; and d) repeating steps a) through c) until the via is substantially filled with copper, whereby Cu interfaces between dielectric interlevels are formed without masking adjoining non-conductive surfaces.

15. A method as in claim 12 in which the Cu stud is formed in step d) primarily from the progressive deposition of Cu on the via walls, whereby the Cu deposition processes used to form a stud are expedited.

16. A method as in claim 15 in which step b) includes performing the ion etch in a low pressure environment of less than approximately 10 mT, whereby the anisotropic ion flow minimizes etching of Cu formed on the via walls, and so expedites the formation of the Cu stud.

17. A method as in claim 15 in which the via vertical wall surface is non-conductive, whereby the Cu deposited on the via walls in step c) is initially deposited on a non-conductive surface.

* * * * *